United States Patent
Plat et al.

(10) Patent No.: US 6,210,050 B1
(45) Date of Patent: Apr. 3, 2001

(54) RESIST DEVELOPING METHOD AND APPARATUS WITH NOZZLE OFFSET FOR UNIFORM DEVELOPER APPLICATION

(75) Inventors: Marina V. Plat, San Jose; Christopher F. Lyons, Fremont, both of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/203,297

(22) Filed: Dec. 1, 1998

(51) Int. Cl.$^7$ .................................................. G03D 5/00
(52) U.S. Cl. ................................................ 396/604; 396/611
(58) Field of Search .................................. 396/604, 611, 396/627; 118/52, 56, 320, 500, 316, 716, 726; 427/240, 247

(56) References Cited

U.S. PATENT DOCUMENTS

| | | | |
|---|---|---|---|
| 4,222,656 | 9/1980 | Harrell et al. | 390/611 |
| 5,555,234 | 9/1996 | Sugimoto | 396/611 |
| 5,625,433 | 4/1997 | Inada et al. | 396/627 |
| 5,626,913 | * 5/1997 | Tomoeda et al. | 427/240 |
| 5,740,488 | 4/1998 | Fujimoto | 396/611 |
| 5,820,038 | 10/1998 | Beltran et al. | 239/750 |

FOREIGN PATENT DOCUMENTS 57-130570  * 8/1982  (JP) .............................. 396/FOR 942

* cited by examiner

Primary Examiner—D. Rutledge
(74) Attorney, Agent, or Firm—Renner, Otto, Boisselle, & Sklar LLP

(57) ABSTRACT

A resist developing method and apparatus for developing resist formed on a semiconductor wafer includes a rotating platform for supporting the wafer and a nozzle for applying developer to the resist. The nozzle is situated above the wafer and is positioned to be offset from an axis of rotation of the wafer during application of the developer to the resist. During application of the developer, the wafer is rotated at a rotational speed which allows the developer to remain on the wafer without flowing past the semiconductor edges. The developer is preferably applied for a time period less than or equal to 2 seconds.

22 Claims, 3 Drawing Sheets

RESIST DEVELOPING METHOD AND APPARATUS WITH NOZZLE OFFSET FOR UNIFORM DEVELOPER APPLICATION

TECHNICAL FIELD

The present invention relates to a resist developing method and apparatus. More particularly, the present invention relates to a resist developing method and apparatus which utilizes an offset nozzle to apply a uniform layer of developer to a photoresist thereby enhancing critical dimension control.

BACKGROUND OF THE INVENTION

In the semiconductor industry, there is a continuing trend toward producing semiconductor wafers having higher device densities. To achieve these high densities there has been and continues to be efforts toward scaling down the device dimensions in the wafers. In order to accomplish such high device packing density, smaller and smaller features sizes are required. This may include the width and spacing of interconnecting lines and the surface geometry such as comers and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source of radiation (such as ultraviolet light, x-rays, or an electron beam) illuminates selected areas of the surface through an intervening master template, the mask, having a particular pattern. The lithographic coating is generally a radiation-sensitized coating suitable for receiving a projected image of the pattern formed in the mask. Once the image is projected, it is indelibly formed in the coating. Exposure of the resist to the radiation through the photomask causes the image area on the resist to become either more or less soluble (depending on the coating) in a particular developer solvent.

In order to form the actual patterns in the resist following exposure to radiation, the resist undergoes a subsequent development step in which a developer is applied thereto. The developer serves to remove the more soluble areas of the resist and leave behind the patterned image which will serve as a mask for etching of the underlying semiconductor layers of the wafer. Unfortunately, however, areas which are less soluble to the developer are also slowly eroded by the developer thereby distorting the desired resist pattern. Thus, it is beneficial to utilize a development process which exposes the resist to a developer for a minimum amount of time and in which the amount of developer applied to the resist at any given location is uniform so that resist erosion occurs evenly across the wafer.

Generally, there are three main methods for developing the photoresist: immersion developing, spray developing, and puddle developing. In immersion developing, several wafers are batched-immersed and agitated in a bath of developer. This development process has an advantage in that it allows for high throughput. However the exposure time of the resist to the developer is often long and the overall process typically does not allow for the tight critical dimension control required in the newer more densely populated semiconductor wafers.

In spray development, the developer is sprayed onto a resist at a preset optimal spray velocity while the wafer is spun at a high speed of approximately 1000 to 2000 rpm. Each wafer is treated with a fresh dose of developer solution. While spray development is generally an effective method to dissolve resist, it is often difficult to control the precise application of the developer to the wafer through the spray nozzle. For instance, during application of the developer a portion of the developer may be sprayed outside of the wafer surface. Thus, as a certain amount of developer is typically wasted, it takes a longer amount of time to apply the desired amount of developer to the resist at the preset spray velocity. As a result, the resist is exposed to the developer for a longer period of time than is often acceptable for the tight critical dimension control needed with respect to the denser semiconductor wafers being produced today.

In puddle development, a predetermined amount of developer is initially dispensed onto the resist surface while the wafer rotates at a relatively slow speed of approximately 50 rpm, for instance. As the developer is applied to the wafer, the spinning causes the developer to become uniformly spread over the surface. Application of the developer is typically accomplished using a generally rectangular shaped nozzle positioned over the wafer in a symmetrical, centered fashion so as to coincide with the axis of rotation of the wafer. As the wafer is rotated, the nozzle dispenses the developer onto the resist. Unfortunately, during application of the developer, a center portion of the wafer is continuously exposed to fresh developer while the remaining portions are only exposed to fresh developer at those instances where such portions pass under the rectangular shaped nozzle. This, in turn, causes a non-uniform layer of developer to be applied to the wafer thereby deleteriously impacting critical dimension control of the patterned resist.

Accordingly, there exists a need in the art for a method and apparatus of developing a resist which overcomes the drawbacks described above and others.

SUMMARY OF THE INVENTION

The present invention provides a method and apparatus for developing a resist which provides tight critical dimension (CD) control. Tight CD control is achieved by reducing the amount of fresh developer applied to the resist, reducing the amount of time it takes to form puddles, and minimizing the amount of wasted developer which overflows past the wafer boundaries.

In order to provide such features, the present invention utilizes a developer application system in which a nozzle which expels developer is positioned to be offset from an axis of rotation of the wafer. For example, the nozzle may be offset by approximately 3–5 mm. Accordingly, during rotation of the wafer, a center portion of the wafer is not continuously applied with fresh developer thereby allowing for a more uniform distribution of fresh developer over the entire wafer surface. This, in turn, aids in maintaining tight control over CD variations.

Further, a time "t" during which developer material is applied to the resist is reduced such that preferably $t \leq 2$ sec. Also, the speed at which the wafer is rotated is controlled such that substantially no developer material is allowed to overflow past the boundaries of the wafer. For instance, the rotational speed of the wafer may be between 10–100 rpm depending on the application at hand. In this manner, the amount of time the resist is exposed to the developer is substantially reduced since virtually no developer is wasted and the overall application time is reduced below conventional development processes. In turn, tighter CD control is possible.

Thus, according to one aspect of the present invention, a resist developing apparatus for developing a resist formed on a semiconductor wafer is provided. The resist developing apparatus includes a nozzle disposed above the wafer for applying developer to the resist, and means for rotating the wafer relative to the nozzle, wherein the nozzle is positioned to be offset from an axis of rotation of the wafer during application of the developer to the resist.

In accordance with another aspect of the present invention, a resist developing apparatus for developing a resist formed on a semiconductor wafer is provided. The resist developing apparatus includes means for rotating the wafer, and means for applying a developer onto the resist such that substantially none of the developer directly incident on the resist from the means for applying the developer is incident at a center of the wafer.

In accordance with yet another aspect of the present invention, a method of developing a resist is provided. The method includes the steps of rotating a semiconductor wafer, and applying a developer to a resist formed on the wafer, the developer being applied during rotation of the wafer and from a position above the wafer which is offset from a center of the wafer by a predetermined distance.

In accordance with still another aspect of the present invention, a method of developing a resist is provided. The method includes the steps of rotating a semiconductor wafer having the resist formed thereon, and applying a developer to the resist during rotation of the wafer such that substantially none of the developer is directly incident on a center of the wafer.

To the accomplishment of the foregoing and related ends, the invention then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed and the present invention is intended to include all such embodiments and their equivalents. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts.

Figure 1:
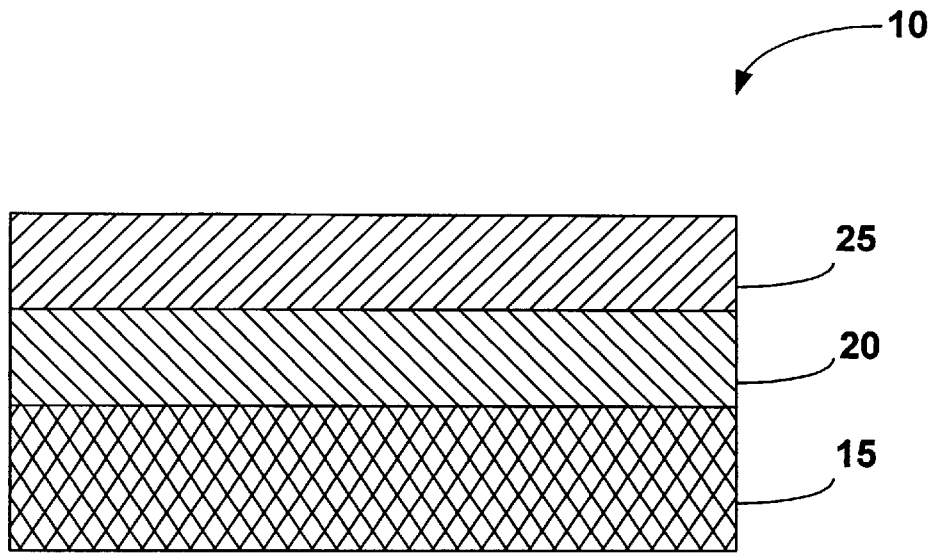
FIG. 1 illustrates a partial cross-sectional view of a wafer having an undeveloped resist layer formed thereon according to the present invention.

Referring initially to FIG. 1, there is depicted a cross-sectional view of a semiconductor wafer 10 (hereinafter "wafer 10") prior to entering the resist development process (hereinafter "development process") described in detail below. At this stage in the manufacturing cycle, the wafer 10 is shown to include a substrate 15, a film layer 20 (hereinafter "film 20") and, a photo-resist layer 25 (hereinafter "resist 25"). The film 20 is formed over the substrate 15 and will be etched in accordance with the pattern formed in the resist 25. The resist 25 is formed over the film 20. In the present invention the resist 25 is a positive resist such that areas of the resist 25 exposed to radiation during photo-lithography are dissolved during the development process leaving behind the desired resist pattern to serve as a mask during subsequent etching steps. It will be appreciated, however, that the present invention is not limited to a positive resist and a negative resist could also be used. Further, it will be appreciated that while the present invention depicts the wafer 10 to include three layers of materials prior to the development process, additional layers of materials such as anti-reflective coatings (ARC's) or the like which are conventionally known may also be included as part of the wafer 10.

Figure 2:
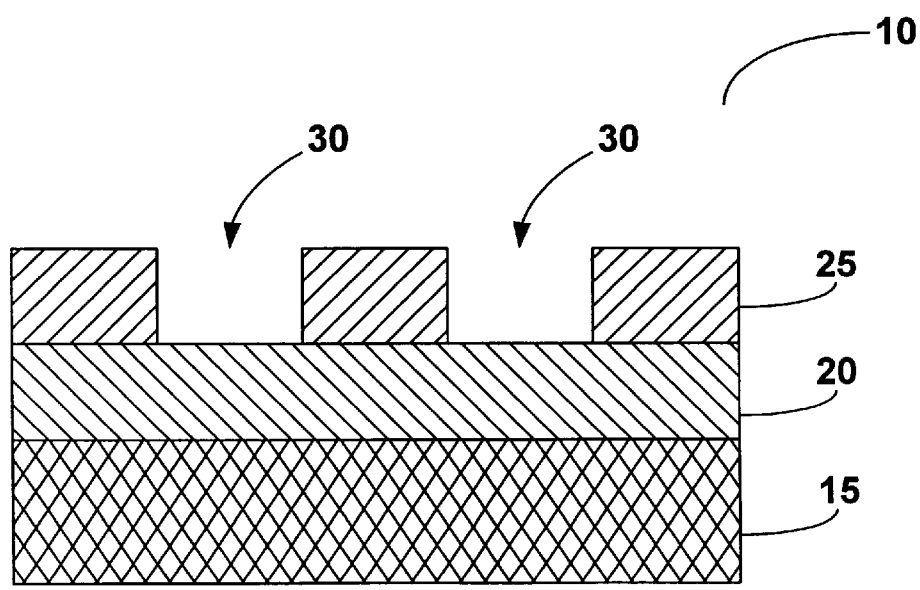
FIG. 2 illustrates a partial cross-sectional view of the wafer of FIG. 1 following resist patterning and development according to the present invention.

Referring now to FIG. 2, there is depicted a cross-sectional view of the wafer 10 following the development process in accordance with the present invention. As shown, following the development process, the resist 25 is patterned to include developed regions 30 through which etching of lower layers will take place. As is discussed in more detail below, the present invention allows for patterning of the resist 25 during the development process which provides tighter CD control than is conventionally available. For instance, the line width and/or spacing of the patterned resist 25 is better controlled by more uniformly distributing a developer over the resist 25 during the development process. Also, such CD's are better controlled by reducing the overall amount of time a developer solution (hereinafter "developer") remains on the resist.

Figure 3:
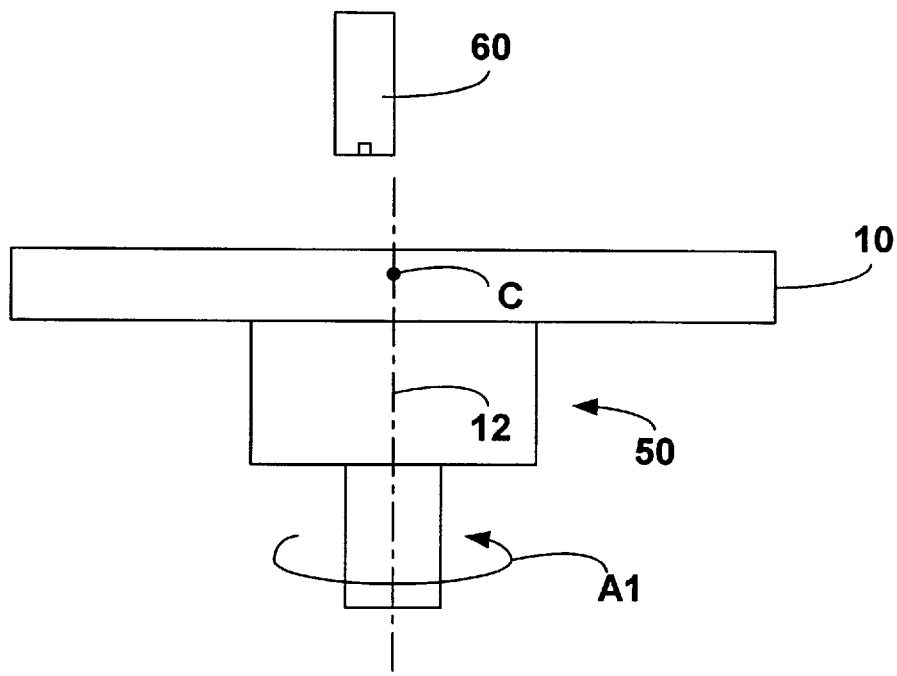
FIG. 3 illustrates a diagrammatic side view of the resist development process in which the nozzle which applies the developer onto the wafer is offset from the center of rotation of the wafer in accordance with the present invention.
Figure 4:
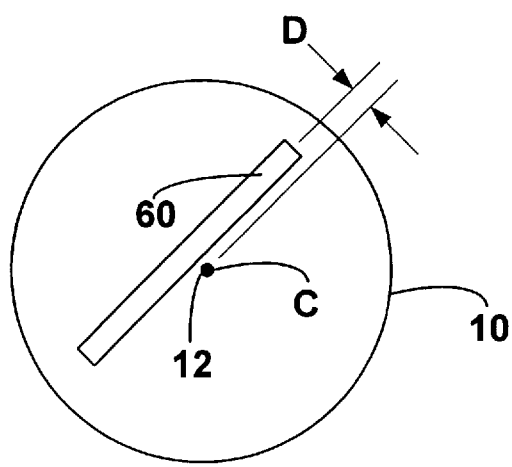
FIG. 4 is a top view of the resist development process depicted in FIG. 3.
Figure 5:
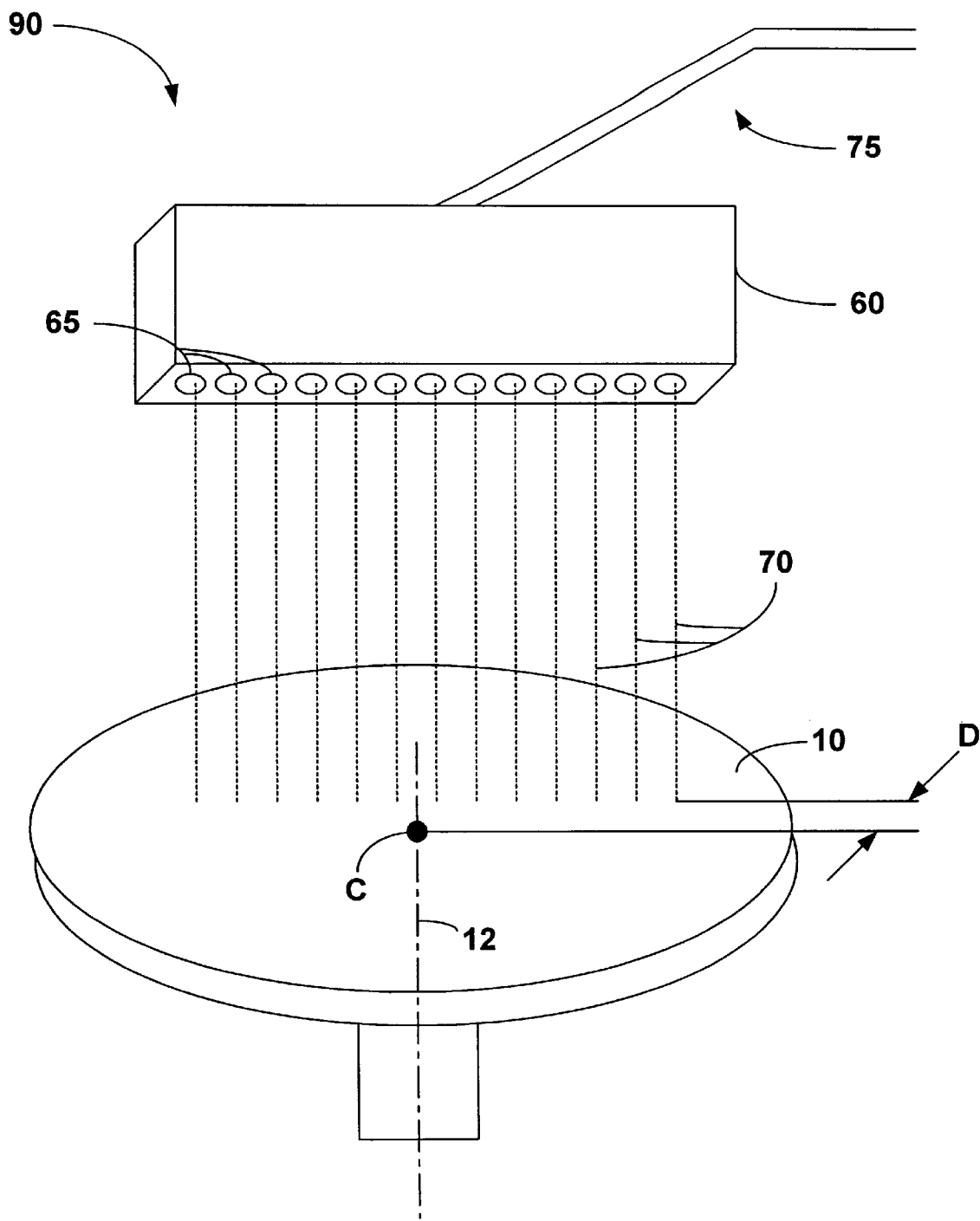
FIG. 5 is an isometric view of the resist development process depicted in FIG. 3.

Referring now to FIGS. 3-5 the development process and apparatus according to the present embodiment is described in more detail. As shown in FIG. 3, prior to development, the wafer 10 is secured to a rotating platform 50 which rotates the wafer 10 about it axis of rotation 12 at relatively controlled rotational speeds during the manufacturing process. The rotating platform 50 is rotated by a motor (not shown) in a conventional manner. In the present embodiment, the rotating platform 50 is depicted to rotate in a counter-clockwise direction by arrow Al, however the rotating platform 50 may also be rotated in a clockwise direction.

As best seen in FIGS. 3–4, during the development process, a developer application nozzle 60 (hereinafter "nozzle 60") is situated above the wafer 10 by approximately 1 mm although such height may be varied in accordance with the application at hand. Further, the nozzle 60 is offset from the axis of rotation 12 of the wafer 10 by a distance D. The nozzle 60 may be any conventional type of nozzle 60 suitable for applying developer to the wafer 10 during a puddle development process. For example, the nozzle 60 may be a drip nozzle such as the $E^2$ Nozzle (TM) produced by Tokyo Electronic Limited, Co. of Tokyo, Japan.

As best seen in FIG. 5, the developer nozzle 60 of the present embodiment is generally rectangular in shape and includes a plurality of apertures 65 for dispensing developer 70 onto the wafer 10. A mechanical arm assembly 75 is secured to the nozzle 60 and serves to position the nozzle 60 in a desired manner in accordance with conventional techniques. A central computer (not shown) is used to control the operations of the nozzle 60, the arm assembly 75, and the motor for rotating the rotating platform 50 in accordance with the present invention. Of course, other dedicated processing devices could be used in place of one central computer.

According to the present invention, the distance D by which the nozzle 60 is offset from the axis of rotation 12 is such that the developer 70 dispensed onto the wafer 10 is sufficiently close to a center C of the wafer 10 that the developer 70 will uniformly spread across the center C as a consequence of the rotational forces exerted as the wafer 10 is spun on the rotating platform 50. In the present embodiment, at a rotational speed of approximately 30 rpm, for example, the nozzle 60 may be offset from the axis of rotation 12 of the wafer 10 by a distance D of between 3–5 mm. The distance D that the nozzle 60 may be offset for any given application yet still obtain a uniform application of developer may be readily determined empirically or calculated by one in the art using known fluid dynamic properties of the developer 70 at the expected rotational speed of the wafer 10.

By offsetting the nozzle 60 with respect to the axis of rotation 12 of the wafer 10, the present invention is able to apply a uniform amount of fresh developer across the wafer 10 thereby improving overall CD control. In conventional systems in which the nozzle is centered above the axis of rotation of the wafer, a central portion of the wafer is continually applied with a fresh coating of developer while the remaining portions of the wafer are only exposed to fresh developer at those instances where such portions are rotated under the nozzle. Unfortunately, such application of developer causes the resist at the central portion to erode to a greater extent than the resist at other portions of the wafer thereby causing non-uniformaties which lead to difficulties in CD control. By offsetting the nozzle 60 in accordance with the present invention, however, the central portion is no longer continually applied with fresh developer. Rather, the developer spreads to the center portion after being applied to the rotating wafer 10 from its offset position. In this manner, the amount of fresh developer applied to any one given area is not substantially more than that applied to other areas thereby allowing for tighter CD control.

In operation, following formation of the resist 25 (FIG. 1) on the wafer 10 and exposure of the resist 25 to radiation through a mask for patterning the resist, the wafer 10 is introduced to a resist development station 90 as shown FIG. 5 where the resist 25 undergoes the development process. The wafer 10 may be introduced to the station 90 on a conveyer belt (not shown) along which the wafer 10 moves while situated on the rotating support 50. Alternatively, the wafer 10 may be manually introduced to the station 90 or be introduced thereto in a number of other conventional manners.

At the station 90, the wafer 10 is situated such that the nozzle 60 above the wafer 10 is offset from the axis of rotation 12 of the wafer 10 by the distance D as discussed above. In the present embodiment, the distance D which the nozzle 60 is offset from the axis of rotation 12 is between 3–5 mm. If the wafer 10 is not properly situated to provide the appropriate offset of the nozzle 60, the nozzle 60 itself may be repositioned via arm assembly 75.

Once properly positioned, the rotating support 50 rotates the wafer 10 at a rotational speed preferably in the range of 10–130 rpm and in the present embodiment is set at 100 rpm, for example. During such rotation the nozzle 60 begins dispensing the developer 70 onto to the resist 25 disposed on the wafer 10. The dispensing of the developer 70 is such that substantially none of the developer is directly incident on the resist 25 at the center C of the wafer 10 (FIG. 5). Further, the developer 70 is dispensed such that the developer 70 is incident on the resist surface at substantially an orthogonal angle. However, it will be appreciated that the developer 70 could be incident on the wafer 10 at any angle without loss to the benefits described herein.

The rotational speed of the wafer 10 is preferably set such that substantially all of the developer 70 remains on the surface of the resist 25 during the development process. In other words, the rotational speed is such that virtually none of the developer 70 is wasted by spreading past the edge of the wafer 10. In this manner, the time it takes to dispense the requisite amount of developer 70 over the resist 10 is minimized. This in turn exposes the resist 25 to the developer 70 for a minimal amount of time thereby allowing for tighter CD control.

In the present embodiment, the developer 70 is applied to the wafer 10 for a time period "t" wherein preferably $t \leq 2$ seconds. Because the rotational speed of the wafer 10 is such that virtually no developer is wasted, the application of developer 70 for this length of time is sufficient to provide a desired amount of developer 70 which is uniformly spread across the entire resist 25 (i.e. the developer 70 is formed in a puddle on the wafer 10). Consequently, excessive developer 70 need not be applied since substantially none of the developer 70 is wasted by flowing over the edges of the wafer 10. By comparison, most conventional development processes apply the developer for at least 3 seconds thereby exposing the resist to fresh developer for a longer period of time than the present invention.

Following application of the developer, the resist pattern is developed in the manner depicted in FIG. 2 and a stream of deionized water is directed onto the wafer 10 to remove any remaining developer as is conventional. Next, the wafer 10 is spindried and the resist development process is complete.

Thus, using the resist development process described above, the present invention allows for tighter CD control of the patterned resist which ultimately leads to more accurate etching of the underlying layers so as to allow for a large number of circuits to be produced on a single wafer.

The invention has been described with reference to the preferred embodiments. Obviously, modifications and alterations will occur to others upon reading and understanding the preceding detailed description. For example, while the preferred embodiments described herein have focused on a puddle development technique, the teachings herein related to offsetting a nozzle to more uniformly distribute fresh developer and related features could also be applied to a spray development process. Additionally, while the embodiments herein have been described such that the wafer is rotated while the nozzle remains stationary, it will be appreciated that the present invention could be employed such that the nozzle is rotated while the wafer remains stationary during application of the developer or alternatively both the nozzle and the wafer could be rotated simultaneously. Nozzle rotation could, for example, be accomplished using any of a given number of known mechanical rotating devices. It is intended that the invention be construed as including all such modifications alterations, and equivalents thereof and is limited only by the scope of the following claims.

What is claimed is:

1. A resist developing apparatus for developing a resist formed on a semiconductor wafer, the apparatus comprising:

a nozzle disposed above the wafer for applying developer to the resist; and means for rotating the wafer relative to the nozzle;

wherein the nozzle is positioned in offset relation from an axis of rotation of the wafer and remains stationary during application of the developer to the resist.

2. The resist developing apparatus of claim 1, wherein the nozzle is offset from the center of axis of the wafer by between 2–5 mm.

3. The resist developing apparatus of claim 1, further comprising means for repositioning the nozzle relative to the axis of rotation of the wafer. ease cancel claim 2, without prejudice.

4. A resist developing apparatus for developing a resist formed on a semiconductor wafer. the apparatus comprising:

a nozzle disposed above the wafer for applying developer to the resist; and means for rotating the wafer relative to the nozzle;

wherein the nozzle is positioned to be offset from an axis of rotation of the wafer during application of the developer to the resist;

wherein the means for rotating is a rotating platform;

wherein the rotating platform rotates the wafer at a rotational speed which allows for substantially all of the developer to remain on the wafer during development of the resist.

5. The resist developing apparatus of claim 4, wherein the rotating platform rotates the wafer at a rotational speed of between 10–130 rpm.

6. The resist developing apparatus of claim 5, wherein the rotating platform rotates the wafer at approximately 100 rpm.

7. The resist developing apparatus of claim 4, wherein the nozzle is offset from the axis of rotation of the wafer by a distance which allows the developer to spread to a center of the wafer during rotation of the wafer about its axis of rotation.

8. A resist developing apparatus for developing a resist formed on a semiconductor wafer. the apparatus comprising:

a nozzle disposed above the wafer for applying developer to the resist; and means for rotating the wafer relative to the nozzle;

wherein the nozzle is positioned to be offset from an axis of rotation of the wafer during application of the developer to the resist;

wherein the nozzle dispenses developer onto the wafer for a time period less than or equal to two seconds.

9. A resist developing apparatus for developing a resist formed on a semiconductor wafer, the resist developing apparatus comprising:

means for rotating the wafer;

means for applying a developer onto the resist such that substantially none of the developer which is directly incident on the resist from the means for applying the developer is incident at a center of the wafer; and wherein the means for applying a developer onto the resist remains stationary.

10. The resist developing apparatus of claim 9, wherein the means for applying the developer is a nozzle.

11. A resist developing apparatus for developing a resist formed on a semiconductor wafer, the resist developing apparatus comprising:

means for rotating the wafer; and means for applying a developer onto the resist such that substantially none of the developer directly incident on the resist from the means for applying the developer is incident at a center of the wafer;

wherein the means for rotating rotates the wafer at between 10–130 rpm.

12. A resist developing apparatus for developing a resist formed on a semiconductor wafer. the resist developing apparatus comprising:

means for rotating the wafer; and means for applying a developer onto the resist such that substantially none of the developer directly incident on the resist from the means for applying the developer is incident at a center of the wafer;

wherein the developer directly incident on the resist is a distance away from the center by at least 2 mm.

13. A resist developing apparatus for developing a resist formed on a semiconductor wafer. the resist developing apparatus comprising:

means for rotating the wafer; and means for applying a developer onto the resist such that substantially none of the developer directly incident on the resist from the means for applying the developer is incident at a center of the wafer;

wherein the means for applying the developer applies the developer for a time period of less than or equal to two seconds.

14. A method of developing a resist, comprising the steps of:

rotating at least one of a semiconductor wafer and a nozzle; and applying a developer to a resist formed on the wafer during rotation of the at least one of the wafer and the nozzle, the developer being applied through the nozzle from a position above the wafer which is offset from an axis of rotation of the wafer by a predetermined distance;

wherein an amount of fresh developer applied to any one given area is not substantially more than that applied to other areas.

15. The method of claim 14, wherein the predetermined distance is between 2–5 mm.

16. A method of developing a resist, comprising the steps of:

rotating at least one of a semiconductor wafer and a nozzle; and applying a developer to a resist formed on the wafer during rotation of the at least one of the wafer and the nozzle, the developer being applied through the nozzle from a position above the wafer which is offset from an axis of rotation of the wafer by a predetermined distance;

wherein the wafer is rotated at between 10–130 rpm.

17. The method of claim 16, wherein the developer is applied to the resist for a time period less than or equal to two seconds.

18. A method of developing a resist, comprising the steps of:

rotating at least one of a semiconductor wafer and a nozzle; and applying a developer to a resist formed on the wafer during rotation of the at least one of the wafer and the nozzle, the developer being applied through the nozzle from a position above the wafer which is offset from an axis of rotation of the wafer by a predetermined distance;

wherein the predetermined distance is between 2–5 mm;

wherein the nozzle is rectangular shaped.

19. A method of developing a resist, comprising the steps of:

rotating a semiconductor wafer relative to a nozzle, the wafer having the resist formed thereon; and applying a developer to the resist via the nozzle during rotation of the wafer such that substantially none of the developer is directly incident at a center of the wafer;

adjusting the position of the nozzle relative to the wafer to offset the nozzle from an axis of rotation of the wafer.

20. The method of claim 19, wherein the developer directly incident on the resist is a distance of at least 2 mm from the center of the wafer.

21. A method of developing a resist. comprising the steps of:

rotating a semiconductor wafer relative to a nozzle, the wafer having the resist formed thereon; and applying a developer to the resist via the nozzle during rotation of the wafer such that substantially none of the developer is directly incident at a center of the wafer;

wherein the wafer is rotated at between 10–130 rpm.

22. A method of developing a resist. comprising the steps of:

rotating a semiconductor wafer relative to a nozzle, the wafer having the resist formed thereon; and applying a developer to the resist via the nozzle during rotation of the wafer such that substantially none of the developer is directly incident at a center of the wafer;

wherein the developer is applied to the resist for a time period less than or equal to two seconds.

* * * * *

UNITED STATES PATENT AND TRADEMARK OFFICE
CERTIFICATE OF CORRECTION

PATENT NO.    : 6,210,050 B1
DATED         : April 3, 2001
INVENTOR(S)   : Plat et al.

It is certified that error appears in the above-identified patent and that said Letters Patent is hereby corrected as shown below:

Column 1,
Line 23, replace "comers" with -- corners --.

Column 7,
Lines 12 and 13, remove "ease cancel claim 2, without prejudice."
Line 15, replace "wafer. the apparatus" with -- wafer, the apparatus --.
Line 40, replace "wafer. the apparatus" with -- wafer, the apparatus --.

Column 8,
Lines 6 and 17, replace "wafer. the resist" with -- wafer, the resist --.

Column 9,
Line 16, replace "wafer. comprising" with -- wafer, comprising --.

Column 10,
Line 7, replace "wafer. comprising" with -- wafer, comprising --.

Signed and Sealed this

Twenty-sixth Day of March, 2002

Attest:

JAMES E. ROGAN
*Attesting Officer*     *Director of the United States Patent and Trademark Office*